(12) United States Patent
Uzoh et al.

(10) Patent No.: US 12,707,941 B2
(45) Date of Patent: Aug. 11, 2026

(54) BONDING SURFACE VALIDATION ON DICING TAPE

(71) Applicant: ADEIA SEMICONDUCTOR BONDING TECHNOLOGIES INC., San Jose, CA (US)

(72) Inventors: Cyprian Emeka Uzoh, San Jose, CA (US); Oliver Zhao, Sunnyvale, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 962 days.

(21) Appl. No.: 17/744,383

(22) Filed: May 13, 2022

(65) Prior Publication Data

US 2023/0369136 A1 Nov. 16, 2023

(51) Int. Cl.

*H10P 54/00* (2026.01)
*H10P 72/70* (2026.01)
*H10P 74/20* (2026.01)

(52) U.S. Cl.

CPC ............ *H10P 74/203* (2026.01); *H10P 54/00* (2026.01); *H10P 72/7402* (2026.01)

(58) Field of Classification Search

CPC ..... H01L 21/6836; H01L 21/78; H01L 22/12; H10P 74/203; H10P 54/00; H10P 72/7402; H10P 72/7416; H10P 70/30; H10P 72/744; H10P 72/7412; C09J 4/00; C09J 7/22; C09J 7/38; C09J 9/02; C09J 2203/326; C09J 2301/314; G01B 21/30; G01Q 60/24;

(Continued)

(56) References Cited

U.S. PATENT DOCUMENTS 5,508,107 A 4/1996 Gutman et al.
5,753,536 A 5/1998 Sugiyama et al.

(Continued)

FOREIGN PATENT DOCUMENTS

JP 2003-105292 A 4/2003
JP 2013-033786 A 2/2013

(Continued)

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

(Continued)

*Primary Examiner* — Monica D Harrison

(74) *Attorney, Agent, or Firm* — Knobbe, Martens, Olson & Bear, LLP

(57) ABSTRACT

The disclosed technology relates to methods for forming and/or validating bonding surfaces of integrated device dies mounted on a dicing tape, and dicing tapes used thereof. In some embodiments, such a method for forming and validating a microelectronic assembly may include mounting a substrate to a dicing tape; singulating the substrate while the substrate is mounted to the dicing tape to form a plurality of dies; and validating a bonding surface of at least one die of the plurality of dies while the at least one die is mounted to the dicing tape. In some embodiments, such a dicing tape may include an anti-static adhesive layer arranged on an anti-static base film.

19 Claims, 6 Drawing Sheets

(58) Field of Classification Search
CPC ............. H10W 80/011; H10W 80/312; H10W 80/327; H10W 99/00
USPC ........................................................... 438/14
See application file for complete search history.

(56) References Cited

U.S. PATENT DOCUMENTS 5,771,555 A 6/1998 Eda et al.
6,080,640 A 6/2000 Gardner et al.
6,224,975 B1 5/2001 Wang
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
8,993,412 B1* 3/2015 Iriguchi ................. H01L 24/32 438/464
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,484,240 B2 11/2016 Sugo et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,727,219 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,975,274 B2 4/2021 Kim et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,066,577 B2 7/2021 Mihara et al.
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,329,034 B2 5/2022 Tao et al.
11,348,898 B2 5/2022 DeLaCruz et al.
11,355,443 B2 6/2022 Huang et al.
11,367,652 B2 6/2022 Uzoh et al.
11,380,597 B2 7/2022 Katkar et al.
11,515,291 B2 11/2022 DeLaCruz et al.
2004/0084414 A1 5/2004 Sakai et al.
2006/0057945 A1 3/2006 Hsu et al.
2006/0079011 A1 4/2006 Tandy et al.
2007/0111386 A1 5/2007 Kim et al.
2014/0120293 A1* 5/2014 Gupta ................. H01L 21/6836 428/354
2014/0175655 A1 6/2014 Chen et al.
2015/0064498 A1 3/2015 Tong
2016/0343682 A1 11/2016 Kawasaki
2017/0179073 A1 6/2017 Moriceau et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2019/0115277 A1 4/2019 Yu et al.
2019/0131277 A1 5/2019 Yang et al.
2019/0333550 A1 10/2019 Fisch
2019/0385935 A1 12/2019 Gao et al.
2019/0385966 A1 12/2019 Gao et al.

(56) References Cited

U.S. PATENT DOCUMENTS

2020/0013637 A1 1/2020 Haba
2020/0013765 A1 1/2020 Fountain, Jr. et al.
2020/0035641 A1 1/2020 Fountain, Jr. et al.
2020/0118973 A1 4/2020 Wang et al.
2020/0227367 A1 7/2020 Haba et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0335408 A1 10/2020 Gao et al.
2020/0371154 A1 11/2020 DeLaCruz et al.
2020/0395321 A1 12/2020 Katkar et al.
2020/0411483 A1 12/2020 Uzoh et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0233888 A1 7/2021 Uzoh
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1* 4/2023 Uzoh .................. H01L 21/3212 438/460
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0343734 A1 10/2023 Uzoh et al.
2023/0360950 A1 11/2023 Gao
2023/0361074 A1 11/2023 Uzoh et al.
2023/0375613 A1 11/2023 Haba et al.
2024/0038702 A1 2/2024 Uzoh
2024/0055407 A1 2/2024 Workman
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.
2024/0332184 A1 10/2024 Katkar et al.
2024/0332227 A1 10/2024 Uzoh et al.
2024/0332231 A1 10/2024 Uzoh
2024/0332267 A1 10/2024 Haba et al.
2024/0387419 A1 11/2024 Mrozek et al.
2025/0004197 A1 1/2025 Haba et al.
2025/0006632 A1 1/2025 Chang et al.
2025/0006642 A1 1/2025 Haba et al.
2025/0006674 A1 1/2025 Uzoh et al.
2025/0006679 A1 1/2025 Theil et al.
2025/0006689 A1 1/2025 Uzoh et al.
2025/0054854 A1 2/2025 Katkar et al.
2025/0079364 A1 3/2025 Uzoh et al.
2025/0096191 A1 3/2025 Gao et al.
2025/0112123 A1 4/2025 Katkar et al.

FOREIGN PATENT DOCUMENTS

JP 2016-225388 A 12/2016
JP 2018-160519 10/2018
WO WO 2005/043584 A2 5/2005

OTHER PUBLICATIONS

Moriceau, H. et al., “Overview of recent direct wafer bonding advances and applications,” Advances in Natural Sciences—Nanoscience and Nanotechnology, 2010, 11 pages.

Nakanishi, H. et al., “Studies on SiO2—SiO2 bonding with hydrofluoric acid. Room temperature and low stress bonding technique for MEMS,” Sensors and Actuators, 2000, vol. 79, pp. 237-244.

Oberhammer, J. et al., “Sealing of adhesive bonded devices on wafer level,” Sensors and Actuators A, 2004, vol. 110, No. 1-3, pp. 407-412, see pp. 407-412, and Figures 1 (a)-1 (I), 6 pages.

Plobi, A. et al., “Wafer direct bonding: tailoring adhesion between brittle materials,” Materials Science and Engineering Review Journal, 1999, R25, 88 pages.

Bush, Steve, “Electronica: Automotive power modules from On Semi,” ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion mailed Sep. 5, 2023, International Application No. PCT/US2023/021825, 13 pages.

Morrison, Jim et al., “Samsung Galaxy S7 Edge Teardown,” Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes No. representation that the part in the image is identical to the part identified in the separately submitted reference Bush, Nov. 8, 2018, ElectronicsWeekly.com (“Bush article”); however, the imaged part and the part shown in the Bush article share the part number “ONSEMI AR0820.”.

(56) References Cited

OTHER PUBLICATIONS

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

"Die preparation," Wikipedia, The Free Encyclopedia, https://en.wikipedia.org/wiki/Die_preparation, downloaded Jul. 26, 2022, 2 pages.

"What is UV Tape?" Tape for Semiconductor Process, Furukawa Electric website, www.furukawa.co.jp/uvtape/en/technology/uvtape.html, downloaded Jul. 26, 2022, 5 pages.

* cited by examiner

| Cursor | ΔX(μm) | ΔY(nm) | Angle(deg) |
|---|---|---|---|
| solid line | 15.375 | 13.584 | 0.051 |

| Cursor | ΔX(µm) | ΔY(nm) | Angle(deg) |
| --- | --- | --- | --- |
| solid line | 14.734 | -6.976 | -0.027 |

BONDING SURFACE VALIDATION ON DICING TAPE

BACKGROUND

Field

The following description relates to methods for forming and/or validating bonding surfaces of integrated device dies mounted on a dicing tape, and dicing tapes used thereof.

Description of the Related Art

Microelectronic elements often comprise a thin slab of a semiconductor material, such as silicon or gallium arsenide, commonly called a semiconductor wafer. A wafer can be formed to include multiple integrated chips or dies patterned on a surface of the wafer and/or partly embedded within the wafer. Dies are singulated from the wafer on a dicing tape. In some package designs, the die is mounted to a substrate or a chip carrier, which is in turn mounted on a circuit panel, such as a printed circuit board (PCB). For example, many dies are provided in packages suitable for surface mounting.

Dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

SUMMARY

Representative techniques and devices are disclosed, including process steps for forming a novel microelectronic assembly. Processes include preparing microelectronic components such as dies, wafers, substrates, and the like, for bonding. In various implementations, one or more surfaces of the microelectronic components are formed and prepared as bonding surfaces. The microelectronic components may be stacked and bonded without adhesive at the prepared bonding surfaces.

When performing hybrid bonding techniques, bonding surfaces prepared for hybrid bonding are typically verified/validated by measuring the recess of the contact pads (e.g., copper pads). In some embodiments, the validation step may further include comparing the recess measurements with predetermined or desired measurements. In other embodiments, the validation step may include measuring and confirming the dielectric roughness and/or dielectric rounding of the bonding surfaces. A reliable method to measure pad recess is atomic force microscopy (AFM). An example sample preparation process for AFM may involve, for example, 1) coating the substrate of interest with a protective layer, 2) mounting the coated substrate on a dicing tape, with the device surface coated with the protective layer facing up, 3) singulating the coated substrate into dies on the dicing tape, 4) processing the singulated dies while the dies are mounted on the tape to remove the protective layer and unwanted debris or particulates from the singulation step.

The dies processing steps may further include preparing the bonding surface of the dies for direct bonding. Subsequently, multiple dies between the center and the edge of the cleaned singulated substrate may be removed or picked up. Then, the recess of the conductive features/pads of interest of the removed/picked-up dies may be measured by AFM to ascertain that the recess variation between dies from the center of the substrate and dies from the edge of the substrate is within a specified recess range. The removed/picked-up dies are typically discarded and not returned to the dicing frame, so as to prevent forming unwanted defects in the remaining prepared dies on the frame. Thus, there is a need for an in situ or streamlined method for measuring the recess of dies while they are on the dicing frame. A key benefit of which is that dies (especially known good dies as verified by the AFM measurement) are not discarded after ascertaining recess of conductive pads. As used herein, the term "validated die" refers to a die in which the contact pad recesses, dielectric roughness, dielectric rounding, and/or other properties of the bonding surfaces have been measured/confirmed and/or compared to a desired value, and the term "validated microelectronic assembly" refers to a microelectronic assembly in which the contact pad recesses, dielectric roughness, dielectric rounding, and/or other properties of the bonding surfaces have been measured/confirmed and/or compared to a desired value. As used herein, the terms "validated/known good die", "known good die as verified by the AFM measurement", and "validated good die" refers to a die that has been tested/measured and is known or has been verified to function properly (for example, to function within certain expected operating parameters, e.g., with predetermined or desired contact pad recesses, dielectric roughness and/or dielectric rounding of the bonding surfaces).

Also, picking up or removing a die from a diced wafer on a dicing tape frame (i.e., a die eject process) before moving the die to the AFM stage is fraught with another challenge. The die eject process generates electrostatic charges which, if not properly dissipated, can damage the live (having a surface prepared for hybrid bonding). If non-conductive dicing tapes are used, it may be difficult to remove the electrostatic charges that accumulated from the die removal step. Some existing dicing tapes include an anti-static/conductive layer, but the anti-static/conductive layer is very thin and may not be effective in removing electrostatic charges for reasons that are discussed below. Electrostatic charging/discharging (ESD) may also occur during AFM operations and cause problems such as making the AFM measurements inaccurate. Therefore, there is a need for developing technologies for dissipating electrostatic charges in processes relating to die verification, and these technologies will become more important as the chip becomes smaller and more easily damaged by discharge electrostatic fields.

In some aspects, a method of forming and validating a microelectronic assembly is disclosed. The method may include mounting a substrate to an anti-static dicing tape; singulating the substrate while the substrate is mounted to the anti-static dicing tape to form a plurality of dies; and validating a bonding surface of at least one die of the plurality of dies while the at least one die is mounted to the anti-static dicing tape. In some embodiments, the method may further include planarizing the substrate before mounting the substrate to the anti-static dicing tape. In some embodiments, the method may further include preparing bonding surfaces of the plurality of dies while the plurality of dies are mounted to the anti-static dicing tape, including activating the bonding surfaces of the plurality of dies. In some embodiments, singulating the substrate comprises partially dicing through a conductive region of the anti-static dicing tape. In some embodiments, the method may further include electrically grounding the anti-static dicing tape during validation of the bonding surface of the at least one die. In some embodiments, validating the bonding surface of the at least one die comprises measuring a conductive pad recess of the bonding surface of the at least one die by a metrological device. In some embodiments, the metrological device is an atomic force microscopy (AFM) device. In some embodiments, validating the bonding surface of the at least one die comprises measuring a surface roughness of the bonding surface of the at least one die by a metrological device. In some embodiments, the metrological device is an atomic force microscopy (AFM) device. In some embodiments, the method may further include picking up the at least one die from the anti-static dicing tape and directly bonding the at least one die to an element without an intervening adhesive after validating the at least one die. In some embodiments, the method may further include electrically grounding the anti-static dicing tape while the at least one die is being picked up from the anti-static dicing tape. In some embodiments, directly bonding the at least one die to an element forms conductor-to-conductor direct bonds and dielectric-to-dielectric direct bonds. In some embodiments, the method may further include removing a protective layer from bonding surfaces of the plurality of dies after the substrate has been singulated. In some embodiments, the anti-static dicing sheet or dicing tape comprises an ultraviolet (UV)-sensitive or pressure-sensitive adhesive layer. In some embodiments, the substrate comprises active circuitry.

In some aspects, a dicing tape comprising an anti-static adhesive layer arranged on an anti-static base film is disclosed. In some embodiments, the dicing tape may have an electrostatic discharge of less than 0.1 C/cm. In some embodiments, the dicing tape may have a resistance of less than $10^9\Omega$. In some embodiments, the anti-static base film comprises conductive carbon. In some embodiments, the anti-static base film comprises a material that does not absorb UV light. In some embodiments, the anti-static adhesive layer is configured for photoactivated debonding. In some embodiments, the anti-static adhesive layer comprises a photoinitiator which creates reactive species upon UV light exposure. In some embodiments, the anti-static adhesive layer comprises monomers or oligomers which polymerize in the presence of the reactive species to reduce adhesion strength. In some embodiments, the anti-static adhesive layer is pressure sensitive. In some embodiments, the thickness of the anti-static adhesive layer is greater than 10 μm. In some embodiments, the anti-static adhesive layer comprises conductive carbon or silica. In some embodiments, the conductive carbon is less than 30% by weight of the anti-static adhesive layer.

In some aspects, a method of forming a microelectronic assembly is disclosed. In some embodiments, the method may include mounting a substrate to an anti-static dicing tape, the anti-static dicing type comprising an anti-static adhesive layer; and singulating through the substrate and partially through the anti-static adhesive layer to form a plurality of dies. In some embodiments, the method may further include planarizing the substrate before mounting the substrate to the anti-static dicing tape. In some embodiments, the method may further include preparing bonding surfaces of the plurality of dies while the plurality of dies are mounted to the anti-static dicing tape, including activating the bonding surfaces of the plurality of dies. In some embodiments, the method may further include picking up at least one die from the anti-static dicing tape and directly bonding the at least one die to an element without an intervening adhesive. In some embodiments, the anti-static dicing sheet or dicing tape comprises an ultraviolet (UV)-sensitive or pressure-sensitive adhesive layer.

In some aspects, a method of forming and validating a microelectronic assembly is disclosed. In some embodiments, the method may include mounting a substrate to a dicing tape; singulating the substrate while the substrate is mounted to the dicing tape to form a plurality of dies; and validating a bonding surface of at least one die of the plurality of dies while the at least one die is mounted to the dicing tape. In some embodiments, the method may further include preparing bonding surfaces of the plurality of dies while the plurality of dies are mounted to the dicing tape, including activating the bonding surfaces of the plurality of dies. In some embodiments, singulating the substrate comprises partially dicing through a conductive region of the dicing tape. In some embodiments, the method may further include electrically grounding the dicing tape during validation of the bonding surface of the at least one die. In some embodiments, validating the bonding surface of the at least one die comprises measuring a conductive pad recess of the bonding surface of the at least one die by a metrological device. In some embodiments, validating the bonding surface of the at least one die comprises measuring a surface roughness of the bonding surface of the at least one die by a metrological device.

In some aspects, a dicing tape including an anti-static adhesive layer arranged on an insulating base film, wherein the thickness of the anti-static adhesive layer is greater than 10 μm, is disclosed. In some embodiments, the thickness of the anti-static adhesive layer is greater than 15, 20, 25, 30, 35, 40, 45 or 50 μm. In some embodiments, the thickness of the anti-static adhesive layer is between 10 to 15, 15 to 20, 20 to 25, 25 to 30, 30 to 35, 35 to 40, 40 to 45, or 45 to 50 μm. In some embodiments, the anti-static adhesive layer has an electrostatic discharge of less than 0.1 C/cm. In some embodiments, the anti-static adhesive layer has a resistance of less than $10^9\Omega$. In some embodiments, the insulating base film comprises polyethylene terephthalate (PET). In some embodiments, the insulating base film comprises a material that does not absorb UV light. In some embodiments, the anti-static adhesive layer is configured for photoactivated debonding. In some embodiments, the anti-static adhesive layer comprises a photoinitiator which creates reactive species upon UV light exposure. In some embodiments, the anti-static adhesive layer comprises monomers or oligomers which polymerize in the presence of the reactive species to reduce adhesion strength. In some embodiments, the anti-static adhesive layer is pressure sensitive. In some embodiments, the anti-static adhesive layer comprises conductive carbon or silica. In some embodiments, the conductive carbon is less than 30% by weight of the anti-static adhesive layer.

In some aspects, a method of forming and validating a microelectronic assembly is disclosed. In some embodiments, the method may include coating a protective layer on the bonding surface of a substrate; mounting the substrate to a dicing tape; singulating the substrate while the substrate is mounted to the dicing tape to form a plurality of dies; cleaning the protective layer from the surfaces of the singulated dies while the singulated dies are mounted to the dicing tape; and validating a bonding surface of at least one die of the plurality of dies while the at least one die is mounted to the dicing tape. In some embodiments, the method may further include directly bonding one of the plurality of dies to another substrate.

In some aspects, a method of validating and forming a microelectronic assembly is disclosed. In some embodiments, the method may include mounting a substrate to a dicing tape; singulating the substrate while the substrate is mounted to the dicing tape to form a plurality of dies; validating a bonding surface of at least one die of the plurality of dies while the at least one die is mounted to the dicing tape; and directly bonding validated good dies of the plurality of dies from the dicing tape to a prepared surface of another substrate. In some embodiments, the method may further include rinsing and drying a dicing frame used to hold the dicing tape, after the validation step. In some embodiments, the dicing tape comprises an anti-staticlayer. In some embodiments, the validation comprises the use of a contact or non-contact metrological device.

In some aspects, a method of forming a microelectronic assembly is disclosed. In some embodiments, the method may include validating a first bonding surface of a first substrate and a second bonding surface of a second substrate while at least one of the first and second substrates is mounted to a dicing tape, the first bonding surface and the second bonding surface having conductive portions surrounded by non-conductive portions; preparing the first bonding surface of the first substrate and the second bonding surface of the second substrate; rinsing and drying the prepared first and second bonding surfaces; and directly bonding the prepared first bonding surface to the prepared second bonding surface without an intervening adhesive layer, wherein preparing the first and second bonding surfaces comprises exposing at least one of the first and second bonding surfaces to a plasma. In some embodiments, the validation comprises the use of a contact or non-contact metrological device. In some embodiments, the method may further include singulating the directly bonded microelectronic assembly.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICs, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die," and the other component that the die is bonded to will be referred to herein as a "substrate."

Implementations are explained in more detail below using a plurality of examples. Although various implementations and examples are discussed here and below, further implementations and examples may be possible by combining the features and elements of individual implementations and examples.

BRIEF DESCRIPTION OF THE DRAWINGS

The detailed description is set forth with reference to the accompanying figures. The use of the same reference numbers in different figures indicates similar or identical items. For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIGS. 3-1 to 3-7 illustrate a method that uses anti-static dicing sheet in hybrid bonding according to some embodiments of the disclosed technology.

FIG. 4 illustrates a cross-sectional view of a top layer of a hybrid bonded structure.

DETAILED DESCRIPTION

Overview

In some embodiments, a die may be prepared for bonding to an element (e.g., a chip or a carrier) by way of direct bonding without an intervening adhesive, such as hybrid direct bonding processes described below and commercially available from Xperi, Inc. of San Jose, CA. For example, the direct bonding process may include the ZIBOND® and/or DBI® processes configured for room temperature, atmospheric pressure direct bonding or the DBI® Ultra process configured for low-temperature hybrid bonding, which are commercially available from Xperi, Inc. of San Jose, CA. The direct bonds can be between dielectric materials of the bonded elements and can also include conductive materials (e.g., copper) at or near the bond interface for direct hybrid bonding. The conductive materials at the bonding interface may be bonding pads formed in or over a redistribution layer (RDL) over a die, and/or passive electronic components. In other embodiments, the conductive material may comprise a contact surface of a TSV (through substrate via or electrode).

When performing hybrid bonding methods, the surfaces prepared for hybrid bonding are typically verified before bonding. The surface preparation process may include, for example: 1) coating the substrate of interest with a protective layer, 2) mounting the coated substrate with the device surface face up on dicing tape, 3) singulating the coated substrate on the dicing tape, 4) processing the singulated substrate while the dies are mounted on the tape to remove the protective layer and unwanted debris or particulates from the singulation step. In some embodiments, the dies surface preparation steps may further include exposing the cleaned surfaces of the singulated dies to a plasma ambient, for example to an oxygen or nitrogen plasma or both. The plasma exposed surfaces may be cleaned and dried. The cleaning step may comprise rinsing the frames with dies, for example, with deionized (DI) water and drying the cleaned frame and mounted dies by spin drying or other known drying methods. The recess of the conductive features or pad of interest can be measured by atomic force microscopy (AFM) to ascertain the recess variation between dies near the center of the substrate and dies near the edge of the substrate are within a specified recess range.

Figures 1, 2, 3, 4, 5, 6, 7:
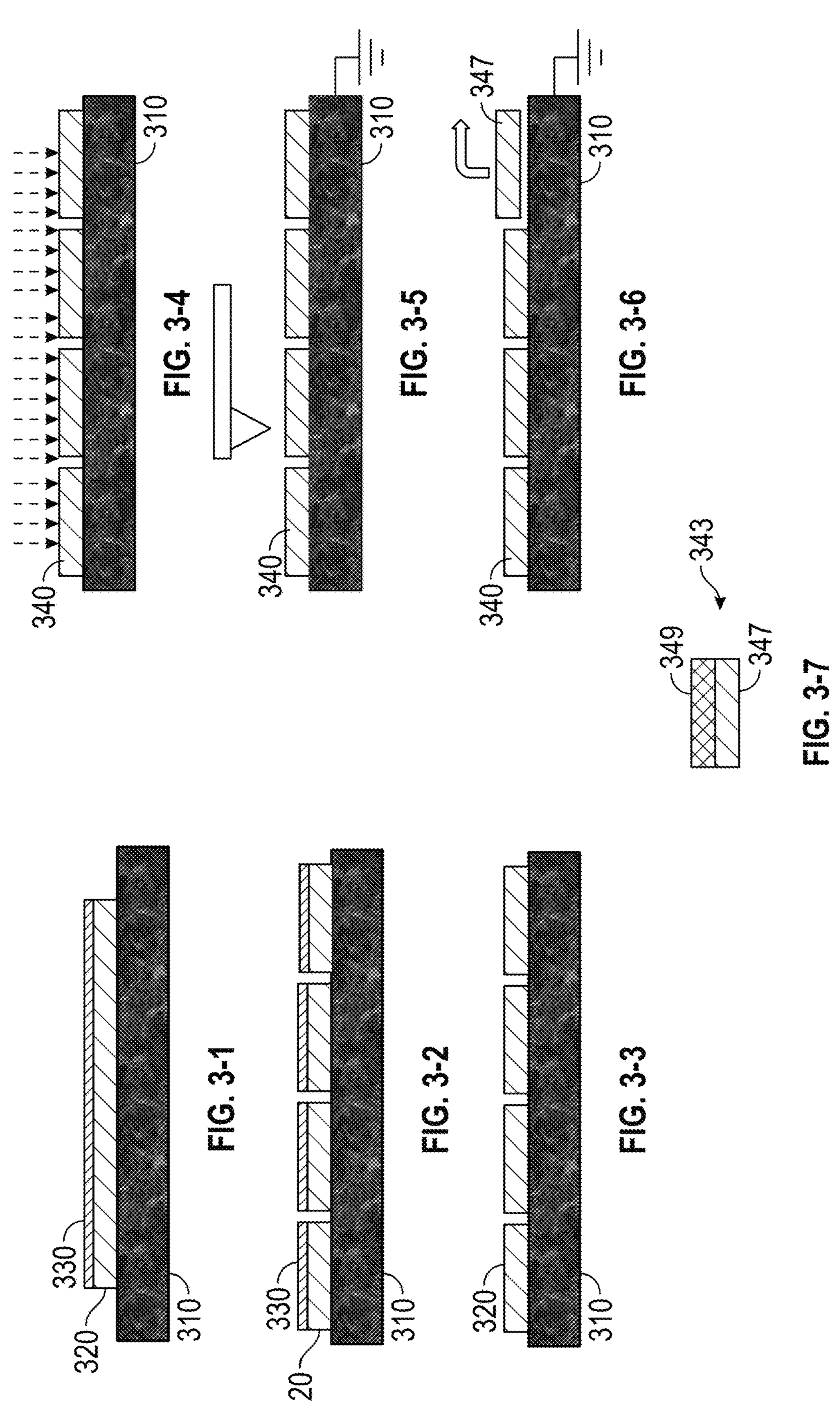
Figure 4:
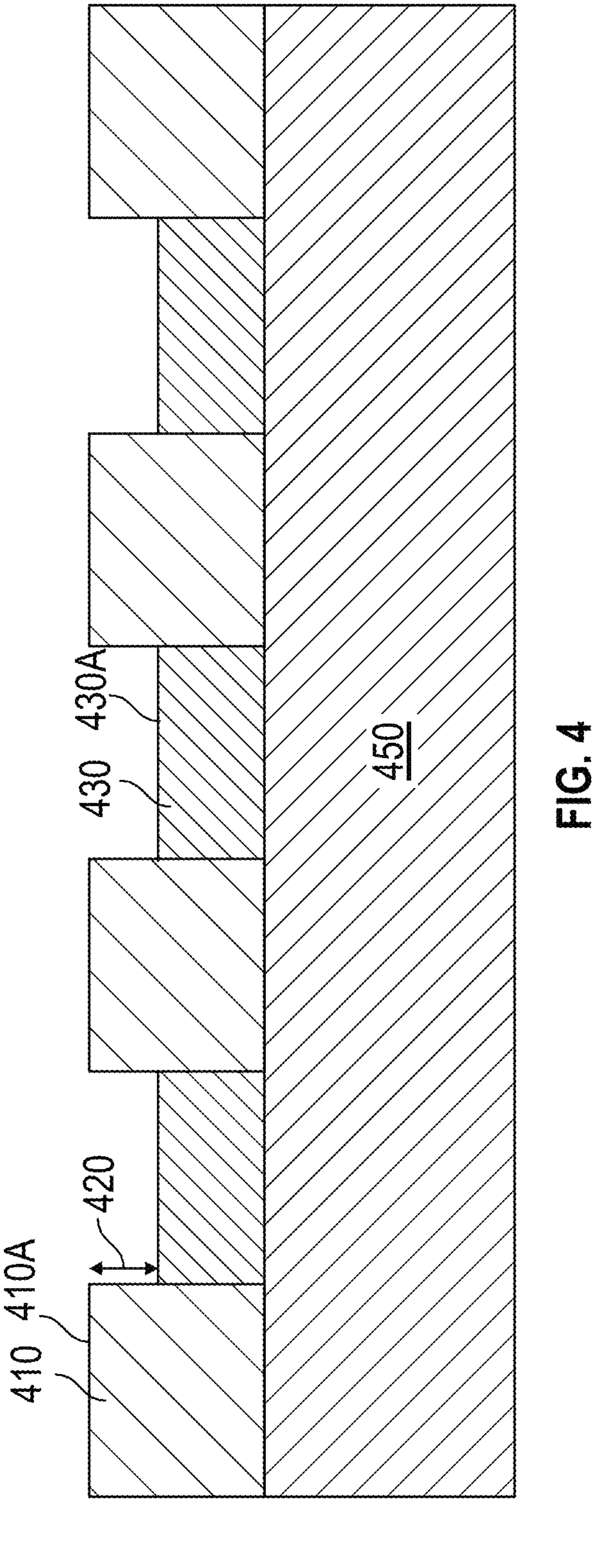

The pad recess can be the distance from the top of the nonconductive bonding layer to the top of the copper pad. An example of a pad recess is illustrated in FIG. 4, a cross-sectional view of a hybrid bonding structure. In FIG. 4, the hybrid bonding structure 400 includes nonconductive bonding layer (e.g., silicon oxide) 410 having a nonconductive bonding layer surface 410A. The metal pads (e.g., copper) 430 having a bonding surface 430A, and the recess 420 is the depth of the step between the nonconductive layer bonding surface 410A and bonding surface 430A. The nonconductive bonding layer 410 and the metal pads may be formed on a bulk semiconductor portion (e.g., silicon) 450, which is patterned with circuitry. In some embodiments, one or more back end of line (BEOL) layers or redistribution layers may be formed between the semiconductor portion 450 and the nonconductive bonding layer 410. Other parameters, such as dielectric rounding, may also be measured prior to direct bonding. In some embodiments, atomic force microscopy (AFM) may be used to measure the pad recess depth, the dielectric roughness, and/or dielectric rounding. Some existing workflow of confirming copper recess may include manually taking a die off a dicing tape frame after a wafer adhered to the dicing tape frame has been singulated into individual dies, and then putting the die on the stage of the AFM. After AFM, it is very difficult to place the die in the exact same position and orientation as it originally was on the dicing tape. A slight change in orientation and location of the die may cause further problems in the process flow during the pick and placing step of die-to-wafer (D2W) bonding. Because of this challenge, the die used for AFM usually will not be placed back onto the dicing tape and may be used for the remainder of the hybrid bonding process flow. Thus, the existing workflow may not be efficient and can cause a loss of usable die and material. The measured dies are typically discarded and not returned to the dicing frame, so as to prevent forming unwanted defects of the prepared dies on the dicing tape.

Reducing the number of steps in the workflow can improve efficiency, for example, by putting the array of singulated dies with the dicing tape frame on the AFM stage. AFM measurements may then be directly performed on the die(s) disposed on the dicing tape. However, typical dicing tapes are non-conductive. If the dicing tapes are non-conductive or contain no metal, there may be a build-up of static charges on or around the die or the dicing tape due to small mechanical vibrations, or other interactions between the die and the tape. When dies are on the dicing tape during the AFM measurement, static charges in the die may affect the interaction between the AFM tip and the die sample, resulting in inaccurate AFM measurement.

Figure 5A:
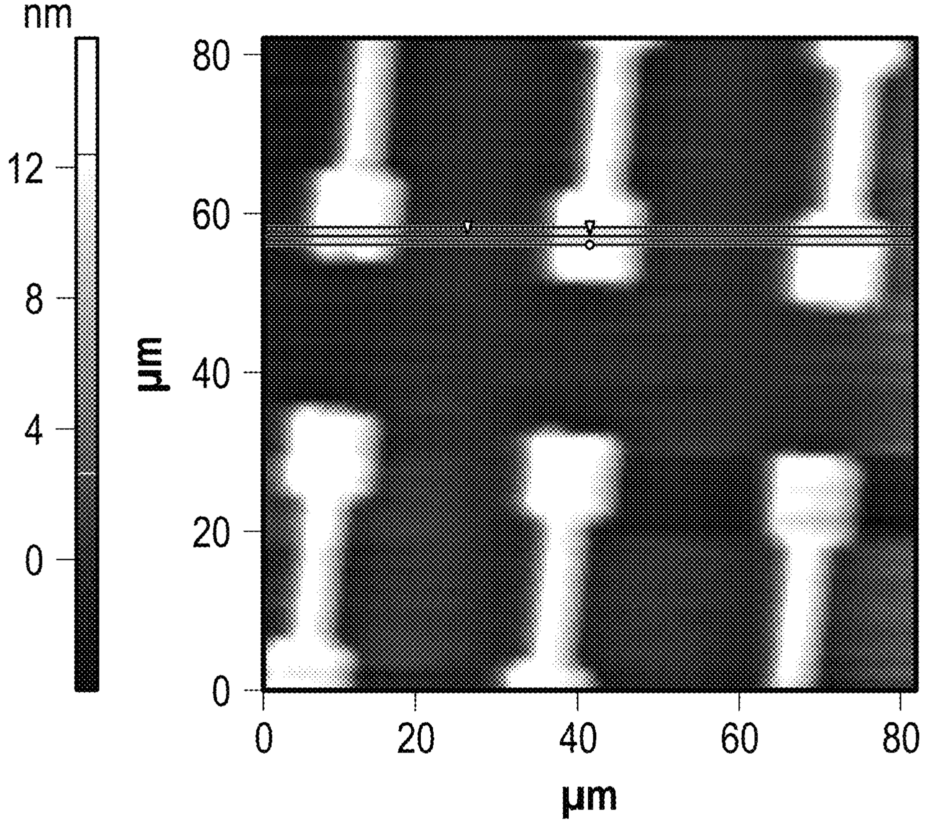
FIGS. 5A to 5D show the effect of static charges on copper pad recess depth measurement.
Figure 5B:
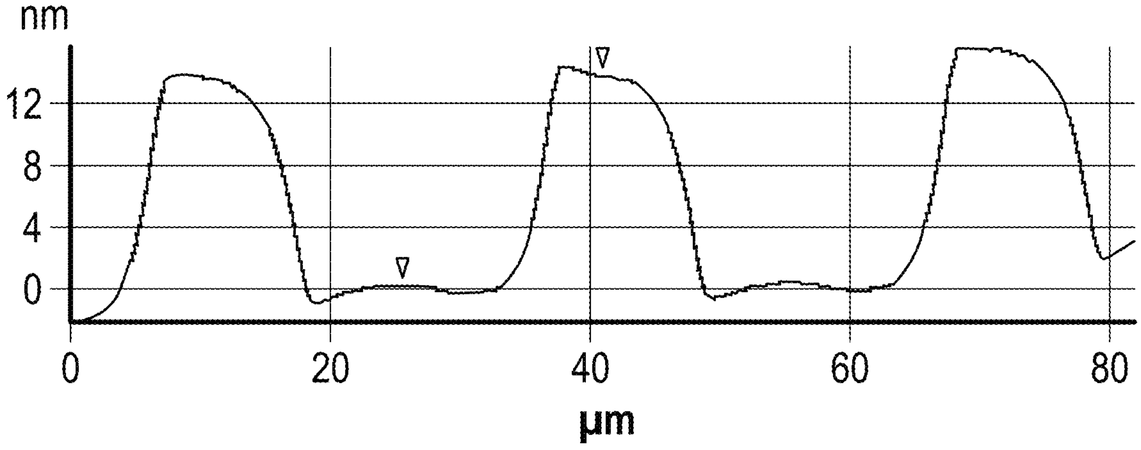
Figures 5C, 5D:
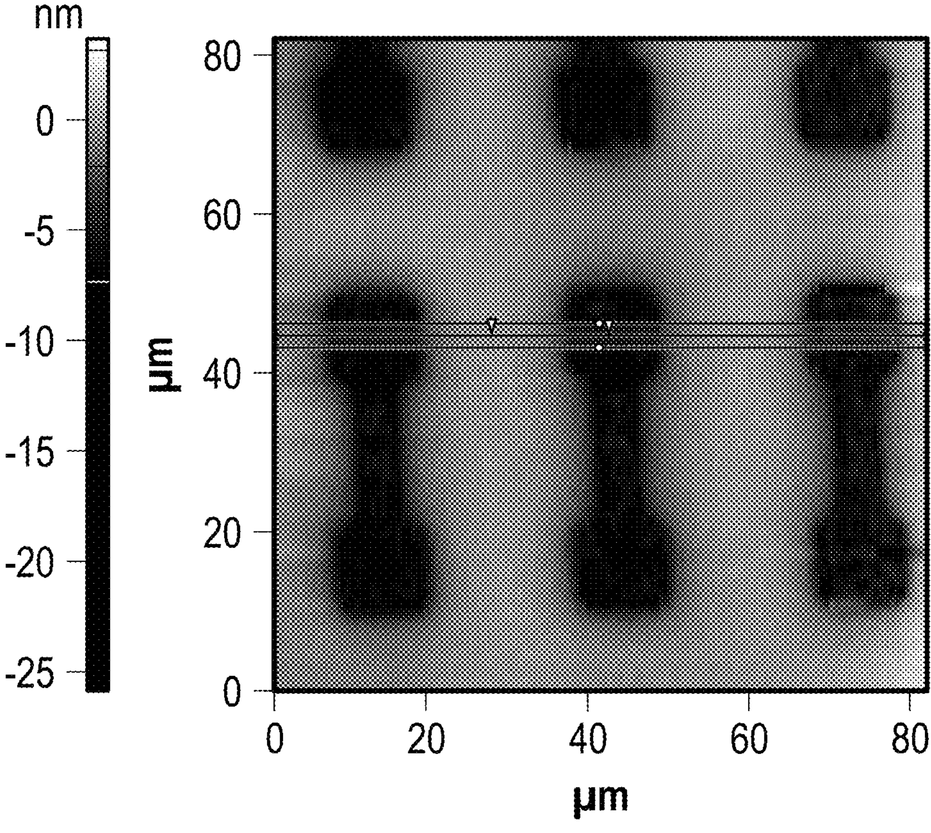

An example of the effect of static charges on copper pad recess depth measurement is shown in FIGS. 5A to 5D. FIG. 5A shows a die having a nonconductive region (dark area) background and the conductive region (white region) measured directly on a non-conductive tape. The results of the measurement suffers from the charging effect; the corresponding measurement result shown in FIG. 5B is that the copper pad appears protruded over the nonconductive background layer by 13.6 nm. FIG. 5C shows the same die measured off the tape, thus does not suffer from the charging effect; the corresponding measurement result shown in FIG. 5D is that the copper pad is recessed by 7.0 nm, which represents the true value. Comparing the results shown in FIG. 5B and FIG. 5D, the recess measurement differs by a factor of 3 due to the effect of static charges. This type of measurement error is unacceptable, because it leads to the erroneous conclusion that the conductive pads are protruded with respect to the surrounding nonconductive layer.

Figure 6B:
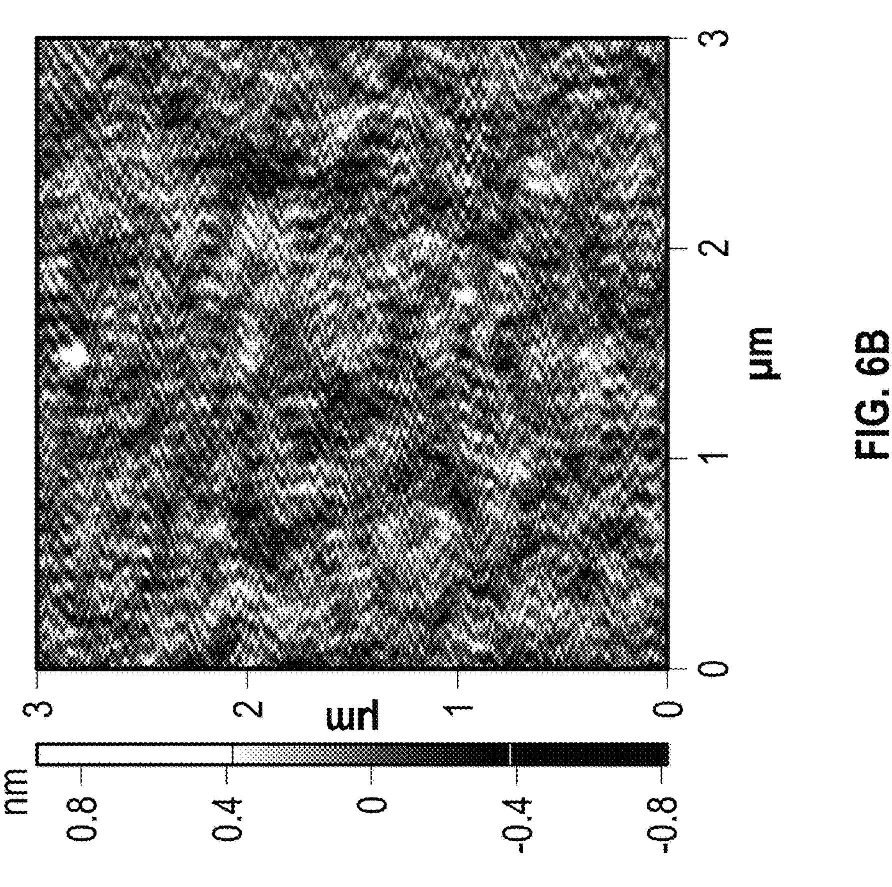
FIGS. 6A to 6B show the effect of static charges on dielectric roughness measurement.
Figure 6A:
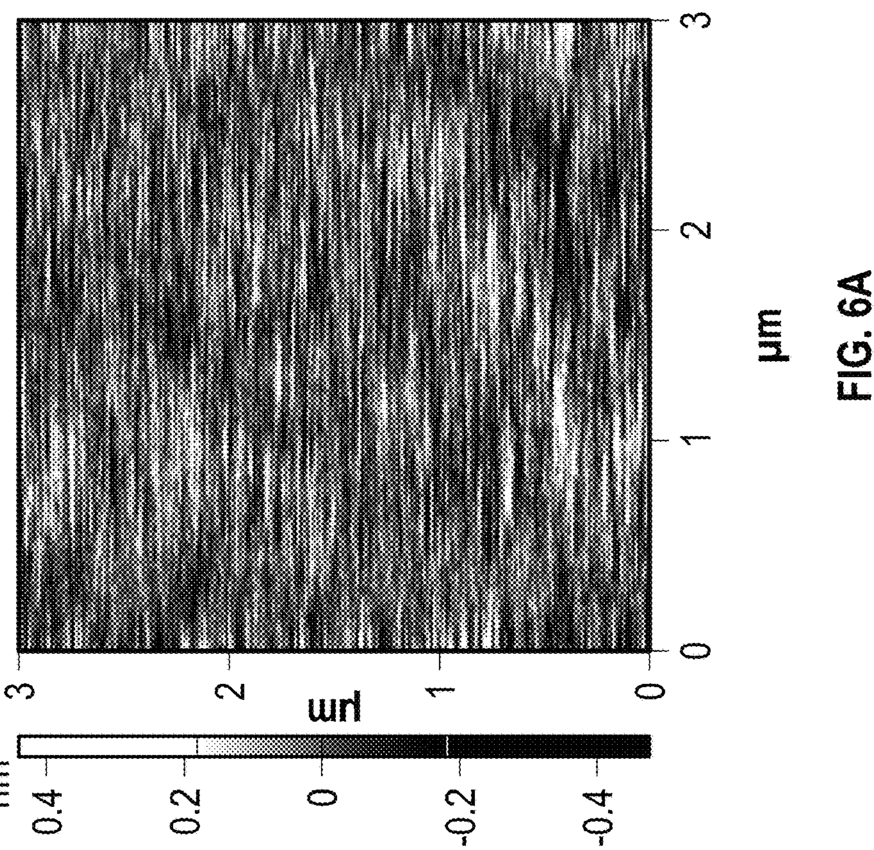

An example of the effect of static charges on $SiO_2$ dielectric roughness measurement is shown in FIGS. 6A to 6B. FIG. 6A shows a die measured directly on a non-conductive tape and suffers from the charging effect; the measured root mean squared roughness is 0.092 nm. FIG. 6B shows the same die measured off the tape, thus does not suffer from the charging effect; the measured root mean squared roughness is 0.196 nm. Comparing the results shown in FIG. 6A and FIG. 6B, the dielectric roughness measurement differs by a factor of 2 due to the effect of static charges.

Moreover, the dies may be damaged by the rapid discharge of accumulated static charges. The smaller the die, the worse the static charge problem is, because relatively more of the tape is exposed with respect to the size of the die. In addition, the tolerance for discharge current and the margin of error are smaller for smaller die. For a 1 mm×1 mm or 0.25 mm×0.25 mm die, the problem may be substantial.

Various embodiments disclosed herein enable the use of a simplified and streamlined process by validating the bonding surfaces of the one or more dies directly on the dicing tape. In various embodiments, the dicing tape can include at least a conductive portion such that electrostatic charges can be properly dissipated. In some embodiments, the disclosed embodiments relates to die processing and bonding surface validation on an at least partially conductive dicing frame tape. In particular, the disclosed technology relates to using at least partially conductive dicing tapes during the singulation of the dies and preparation of the dies for hybrid direct bonding. The ability of the disclosed technology to perform reliable bonding surface characterization directly on a tape frame can streamline quality control processes. Moreover, the prevention of ESD events by a conductive tape in the disclosed technology can contribute to higher product yields and reduce the damage to dies.

Example Dicing Tapes

Standard dicing tapes are non-conductive and are typically made of polyvinyl chloride (PVC), polyolefin, or polyethylene with an adhesive to adhere the die in place. Standard dicing tapes can use a UV or thermal release mechanism. Standard dicing tapes can be approximately 100 μm thick.

Figure 1:
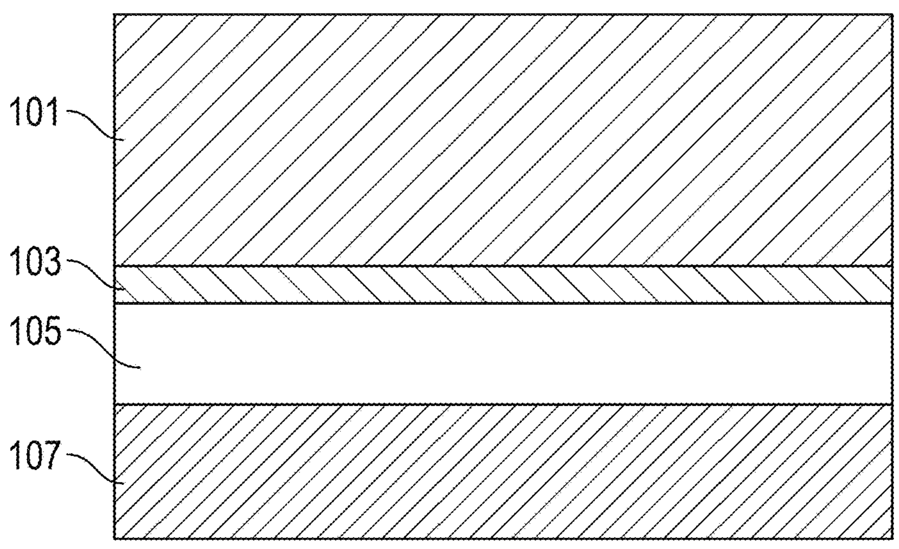
FIG. 1 illustrates a conventional anti-static ultraviolet (UV) release dicing tape film.

FIG. 1 illustrates a conventional anti-static UV release dicing tape film. Upon UV exposure, the acrylic adhesive with a photoactive component reduces adhesion strength by 85-90%, leading to easier removal of film. The dicing tape film includes a base film 101 comprising a nonconductive material, an anti-static layer 103, an adhesive layer 105, and a backing film 107. The anti-static layer 103 may include conductive carbon and/or a filler or nanoparticle such as silica. The anti-static layer 103 is very thin, e.g., less than about 5 μm thick. Upon removal of the backing film 107, a wafer may be contacted to the adhesive layer 105 and adhered to the tape. To singulate dies from the wafer, the user would cut through the wafer, the adhesive layer 105, the anti-static layer 103, and partially into the base film 101 by some amount to keep the base film 101 partially connected to keep the dies together for handling purposes.

Figure 2A:
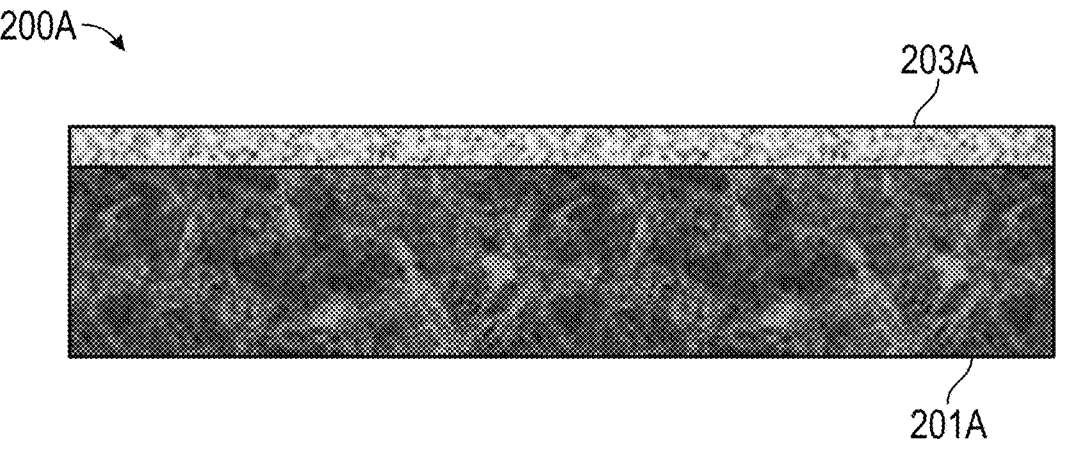
FIGS. 2A to 2B illustrate anti-static dicing sheets according to some embodiments of the disclosed technology.
Figure 2B:
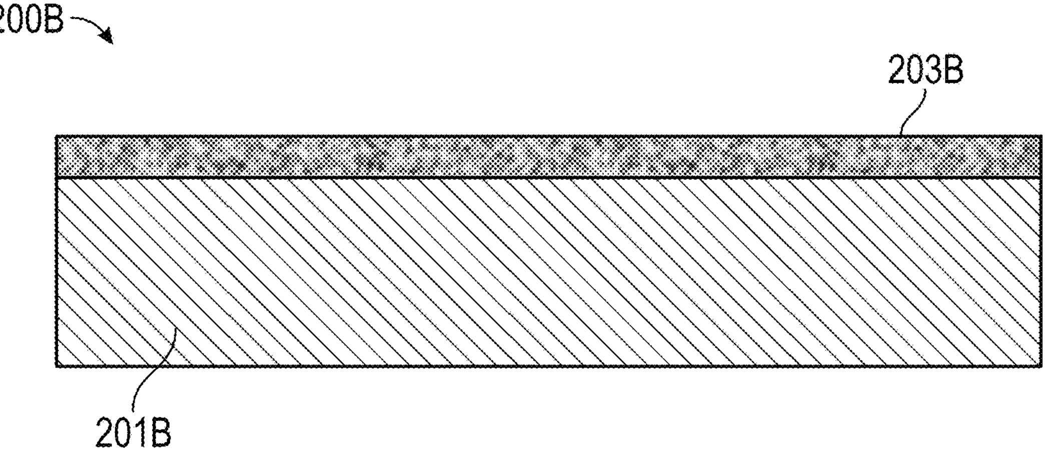

FIGS. 2A to 2B illustrate anti-static dicing tapes or dicing sheets according to various embodiments disclosed herein. In the illustrated embodiments, the at least partially conductive dicing tapes shown in FIGS. 2A to 2B can debond with UV exposure or application of pressure. In the embodiments shown in FIGS. 2A to 2B, the overall anti-static/conductive region is thicker than the depth at which the dicing process cuts into the dicing tape to prevent electrical isolation.

FIG. 2A illustrates a portion of an anti-static tape 200A including two anti-static layers, an anti-static photoactive (e.g., UV-sensitive) adhesive 203A (which may include, e.g., methacrylate polymers), and a base film formed of an anti-static material 201A, together forming an overall anti-static/conductive tape. In some embodiments, conductive carbon and/or silica and/or silicon may be incorporated within the base film 201A and/or within the adhesive 203A. In some embodiments, the tape includes materials that are transparent to UV light within the anti-static base film 201A. In some embodiments, the anti-static base film 201A comprises a material that does not absorb UV light. In some examples, the adhesive 203A may have a thickness greater than 10 μm. In other examples, the adhesive 203A may have a thickness greater than 15, 20, 25, 30, 35, 40, 45 or 50 μm. In other examples, the adhesive 203A may have a thickness between 10 to 15, 15 to 20, 20 to 25, 25 to 30, 30 to 35, 35 to 40, 40 to 45, or 45 to 50 μm. In some examples, the base film 201A may have a thickness greater than 20, 30, 40, 50, 60, 70, 80, 90, or 100 μm. In other examples, the base film 201A may have a thickness between 20 to 30, 30 to 40, 40 to 50, 50 to 60, 60 to 70, 70 to 80, 80 to 90, or 90 to 100 μm.

FIG. 2B illustrates a portion of an anti-static tape 200B including a single anti-static layer of anti-static photoactive adhesive 203B (which may include, e.g., methacrylate polymers) on an insulating base film 201B. In the embodiments, the insulating base film 201B comprises a polymer, such as polyethylene terephthalate (PET). In the embodiment of FIG. 2B, the overall anti-static/conductive region includes only the layer of anti-static photoactive adhesive 203B. In some embodiments, the tape includes materials that is transparent to UV light within the insulating base film, 201B. In some embodiments, the insulating base film 201B comprises a material that does not absorbs UV light. In some examples, the adhesive 203B may have a thickness greater than 10 μm. In other examples, the adhesive 203B may have a thickness greater than 15, 20, 25, 30, 35, 40, 45 or 50 μm. In other examples, the adhesive 203B may have a thickness between 10 to 15, 15 to 20, 20 to 25, 25 to 30, 30 to 35, 35 to 40, 40 to 45, or 45 to 50 μm. In some examples, the base film 201B may have a thickness greater than 20, 30, 40, 50, 60, 70, 80, 90, or 100 μm. In other examples, the base film 201B may have a thickness between 20 to 30, 30 to 40, 40 to 50, 50 to 60, 60 to 70, 70 to 80, 80 to 90, or 90 to 100 μm.

In the embodiments shown in FIGS. 2A to 2B, the adhesive layer 203A or 203B of the tape is greater than 10 μm thick. In other examples, the adhesive layer 203A or 203B may have a thickness greater than 15, 20, 25, 30, 35, 40, 45 or 50 μm. In other examples, the adhesive layer 203A or 203B may have a thickness between 10 to 15, 15 to 20, 20 to 25, 25 to 30, 30 to 35, 35 to 40, 40 to 45, or 45 to 50 μm. In some embodiments, the adhesive layer of the tape may include conductive carbon or silica within a pressure sensitive adhesive with photoactive components. In some embodiments, the tape can be conductive enough to discharge the static charges, for example, the tape may have electrostatic discharge of less than 0.1 C/cm or have resistance of less than $10^6$ to $10^9 \Omega$. In some embodiments, the composition of the conductive carbon used in the anti-static layers is less than 30% by weight, and preferably between 0.1 to 30% by weight. In some embodiments, the tape does not block UV light.

In the embodiments shown in FIGS. 2A to 2B, the adhesive layer 203A, 203B of the tape can allow for photoactivated debonding. For example, the adhesive layer 203A, 203B of the tape may include photoinitiators which absorb UV light and creates reactive species upon UV light exposure, and mono/oligo-mers which polymerize in the presence of the reactive species to reduce adhesion strength. In some examples, the photoinitiator may be an azo initiator, such as 2 2'-azobis(isobutyronitrile). In some examples, the monomers may be acrylic monomers, such as 2-ethyl hexylacrylate, butylacrylate, or 2-hydroxy ethylacrylate.

Additional components of the dicing tape, such as the filler, cross-linking agent, and anti-static agent can be found in U.S. Pat. No. 10,975,274, the disclosure of which is incorporated herein by reference. Further examples of resins and electrically conductive particles that can be used in the anti-static layers can be found in U.S. Pat. Nos. 9,484,240, 11,066,577, 5,508,107, 6,224,975, the disclosures of which are incorporated herein by reference.

Example Methods of Bonding Surface Validation

FIGS. 3-1 to 3-6 illustrate a method that uses anti-static dicing sheet in preparation for hybrid bonding according to some embodiments. To verify the surfaces prepared for hybrid bonding, surface characterization (e.g., using AFM) can be directly performed on one or more dies attached to the conductive dicing tape frame, thus streamlining the quality control process.

The method may start at the step shown in FIG. 3-1, by attaching a wafer/substrate 320 with protective layer 330 facing up to an anti-static dicing tape 310. The anti-static dicing tape 310 may be held by a dicing frame (not shown) in various embodiments. In some embodiments, the dicing tape 310 shown in FIGS. 3-1 to 3-6 can comprise the dicing tape 200A shown in FIG. 2A or the dicing tape 200B shown in FIG. 2B. The substrate 320 shown in FIG. 3-1 may include a planarized bonding surface over a semiconductor device portion, as shown and described herein with respect to FIG. 4. The protective layer 330 can comprise a polymer (such as a photoresist) that protects the bonding surface during dicing.

The method may then move to the step shown in FIG. 3-2, singulating the substrate 320 on the anti-static dicing tape 310. The substrate 320 can be singulated or diced in any suitable manner, for example, by sawing, etching, etc. In some embodiments, the wafer is diced only partially through the conductive region of the tape, such as the overall tape 200A of FIG. 2A, or the anti-static adhesive layer 203B of FIG. 2B. As discussed later, when the tape is electrically grounded, since the tape is only partially cut through the conductive region, the tape can remain electrically connected for discharging.

The method may then move to the step shown in FIG. 3-3, stripping the protective layer 330 from the diced wafer 320 on the anti-static dicing tape 310. The protective layer 330 can be removed in any suitable manner, for example, by exposing the protective layer 330 to an oxygen plasma and cleaning the debris with deionized water and/or other treatment liquids.

The method may then move to the step shown in FIG. 3-4, preparing (e.g., cleaning and activating) hybrid bonding surfaces of the singulated dies 340 attached to the anti-static dicing tape 310. For example, in some embodiments, the singulated dies 340 can be exposed to a nitrogen-containing plasma to activate the bonding surfaces. In some embodiments, the die surface preparation steps may further include exposing the cleaned surfaces of the singulated dies to a plasma ambient, for example to an oxygen or nitrogen plasma or both. The plasma exposed surfaces may be cleaned and dried. The cleaning step may comprise rinsing the frames with dies, for example with deionized (DI) water and drying the cleaned frame and mounted dies by spin drying or other known drying methods. The recess of the conductive features or pad of interest can be measured by AFM to ascertain the recess variation between dies near the center of the substrate and dies near the edge of the substrate are within a specified recess range.

After the hybrid bonding surfaces have been prepared as explained above, the method may move to the step shown in FIG. 3-5, verifying or validating (e.g., with AFM) the prepared hybrid bonding surfaces of the singulated dies 340 while the dies are disposed on the anti-static dicing tape 310. The frame with anti-static dicing tape 310 is disposed over the surface of a flat porous vacuum chuck (not shown). A vacuum is applied to firmly secure the anti-static dicing tape 310 to the surface of the vacuum chuck. In some preferred embodiments, the width or diameter of the pore of the porous chuck may be smaller than the thickness of the anti-static dicing tape 310. As explained here, the AFM process can verify the pad recess depth and/or other features of the bonding surface, such as the amount of dielectric roughness and rounding. In the step shown in FIG. 3-5, the tape may be electrically grounded to provide a discharge path for the static charges. Because the conductive layers, i.e., the tape 200A of FIG. 2A or the anti-static adhesive layer 203B of FIG. 2B. are only partially cut, the conductive layers 200A and 203B remain electrically connected so as to discharge the entire sheet. In some cases, removal process for the protective layer 330 from the diced wafer 320 and other surface preparation steps can change the copper recess of the dies. Thus, the hybrid bonding surface inspection/verification can be more accurate if performed after wafer dicing, removal of the protective layer, and the various surface preparatory steps.

In some embodiments, after verifying or validating the prepared hybrid bonding surfaces of the singulated dies 340 while the dies are disposed on the anti-static dicing tape 310, the method may then move to a step of directly bonding the validated/known good dies from the dicing tape to a prepared surface of another substrate. Alternatively, the method may move to the step shown in FIGS. 3-6 and 3-7, picking up a singulated die 347 from the tape and hybrid bonding of the prepared hybrid bonding surface of the singulated die 347 with an element 349 to form a directly bonded structure 343, while the rest of the singulated dies 340 are mounted to the anti-static dicing tape 310. In some embodiments, picking up the die 347 may include contacting the bonding surface of the die 347 with a pick and place tool formed from a hydrophobic material or coated with a hydrophobic material. In some embodiments, the step of hybrid bonding surface inspection/verification may be performed right before hybrid bonding the die 347 with the element 349, without an intervening step therebetween. In the step shown in FIG. 3-6, the tape 310 may be electrically grounded to provide a discharge path for the static charges. In some embodiments, a stylus with preferably low force, for example less than 20 mg, less than 10 mg or less than 5 mg, may be scanned across the surface of the prepared die to characherize the surface of the die. The tip of the mechanical profiler for the dies may be configured so that it does not introduce undesirable defects, for example scratch or scratches, on the nonconductive and/or conductive portions of the prepared surface of the die or dies. In other embodiments, a non-contact device, for example an optical profiler, may be applied to authenticate or validate the surface of the die.

In some embodiments, the validated dies on the dicing frame may be rinsed with suitable solvent or DI water or both and dried to clean off any contaminating particles from the recess validification step. The directly bonded dies and substrate are annealed at a higher temperature to electrically and mechanically connect the opposing respective pads on the bonding surfaces of the die and the substrate. The annealing temperature may range between 150 to 400° C., and depending on the width and depth of the conductive features, the annealing times may vary between 15 minutes to over 6 hours. In practice, the smaller the recess, the shorter the annealing times; the smaller the width of the conductive features, the higher the bonding temperature.

From the forgoing, a smaller recess (e.g., less than 12 nm) may be more preferable than a large recess (e.g., greater than 25 nm). The validation process can accordingly be an important tool in process control for ascertaining good device cleaning and preparatory steps and for the selection of appropriate post bonding die to substrate annealing conditions.

Further details regarding processing devices on dicing frames can be found in U.S. Pat. Nos. 10,727,219 and 11,037,919, the disclosures of which are incorporated herein by reference.

Electronic Elements

A die can refer to any suitable type of integrated device die. For example, the integrated device dies can comprise an electronic component such as an integrated circuit (such as a processor die, a controller die, or a memory die), a microelectromechanical systems (MEMS) die, an optical device, or any other suitable type of device die. In some embodiments, the electronic component can comprise a passive device such as a capacitor, inductor, or other surface-mounted device. Circuitry (such as active components like transistors) can be patterned at or near active surface(s) of the die in various embodiments. The active surface may be on a side of the die which is opposite the backside of the die. The backside may or may not include any active circuitry or passive devices.

An integrated device die can comprise a bonding surface and a back surface opposite the bonding surface. The bonding surface can have a plurality of conductive bond pads including a conductive bond pad, and a non-conductive material proximate to the conductive bond pad. In some embodiments, the conductive bond pads of the integrated device die can be directly bonded to the corresponding conductive pads of the substrate or wafer without an intervening adhesive, and the non-conductive material of the integrated device die can be directly bonded to a portion of the corresponding non-conductive material of the substrate or wafer without an intervening adhesive. Directly bonding without an adhesive is described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Examples of Direct Bonding Methods and Directly Bonded Structures

Various embodiments disclosed herein relate to directly bonded structures in which two elements can be directly bonded to one another without an intervening adhesive. Two or more electronic elements, which can be semiconductor elements (such as integrated device dies, wafers, etc.), may be stacked on or bonded to one another to form a bonded structure. Conductive contact pads of one element may be electrically connected to corresponding conductive contact pads of another element. Any suitable number of elements can be stacked in the bonded structure. The contact pads may comprise metallic pads formed in a nonconductive bonding region, and may be connected to underlying metallization, such as a redistribution layer (RDL).

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric materials for direct bonding include dielectric materials that do not comprise polymer materials such as epoxy, resin or molding materials; for example, suitable dielectric materials can include inorganic dielectrics, such as silicon oxide, silicon nitride, or silicon oxynitride, or can include carbon, such as silicon carbide, silicon oxycarbonitride, silicon carbonitride or diamond-like carbon.

In various embodiments, hybrid direct bonds can be formed without an intervening adhesive because the dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid direct bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments in the bonding tool described herein and, subsequently, the bonded structure can be annealed. Annealing can be performed in a separate apparatus. Upon annealing, the contact pads can expand and contact one another to form a metal-to-metal direct bond. Beneficially, the use of hybrid bonding techniques, such as Direct Bond Interconnect, or DBI®, available commercially from Xperi of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 5 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. In embodiments described herein, whether a die or a substrate, the first element can be considered a host substrate and is mounted on a support in the bonding tool to receive the second element from a pick-and-place or robotic end effector. The second element of the illustrated embodiments comprises a die. In other arrangements, the second element can comprise a carrier or a flat panel or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a higher concentration of nitrogen can be found at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness. For example, the bonding layers may have a surface roughness of less than 2 nm root mean square (RMS) per micron, or less than 1 nm RMS per micron.

In various embodiments, metal-to-metal bonds between the contact pads in direct hybrid bonded structures can be joined such that conductive features grains, for example copper grains on the conductive features grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes. In some embodiments, the bonded assembly may further be attached to a dicing sheet and singulated. The singulated assembly may be cleaned for subsequent operations. The subsequent operations may include testing the assembly, bonding the singulated assemble to another substrate or package, or molding the singulated assembly.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a microelectronic assembly, comprising:

mounting a substrate to an anti-static dicing tape, the anti-static dicing tape comprising an anti-static adhesive layer; and singulating through the substrate and partially through the anti-static adhesive layer to form a plurality of dies.

2. The method of claim 1, further comprising planarizing the substrate before mounting the substrate to the anti-static dicing tape.

3. The method of claim 1, further comprising preparing bonding surfaces of the plurality of dies while the plurality of dies are mounted to the anti-static dicing tape, including activating the bonding surfaces of the plurality of dies.

4. The method of claim 1, further comprising picking up at least one die from the anti-static dicing tape and directly bonding the at least one die to an element without an intervening adhesive.

5. The method of claim 1, wherein the anti-static dicing tape comprises an ultraviolet (UV)-sensitive or pressure-sensitive adhesive layer.

6. The method of claim 1, further comprising validating a bonding surface of at least one die of the plurality of dies while the at least one die is mounted to the anti-static dicing tape.

7. The method of claim 6, further comprising electrically grounding the anti-static dicing tape during validation of the bonding surface of the at least one die.

8. The method of claim 6, wherein validating the bonding surface of the at least one die comprises measuring a conductive pad recess of the bonding surface of the at least one die by a metrological device.

9. The method of claim 6, wherein validating the bonding surface of the at least one die comprises measuring a surface roughness of the bonding surface of the at least one die by a metrological device.

10. The method of claim 1, wherein singulating through the substrate comprises partially dicing through a conductive region of the anti-static dicing tape.

11. The method of claim 1, wherein the thickness of the anti-static adhesive layer is greater than 10 μm.

12. A method of forming a microelectronic assembly, comprising:

mounting a substrate to an anti-static dicing tape, the anti-static dicing tape comprising an anti-static adhesive layer;

singulating through the substrate and partially through the anti-static adhesive layer to form a plurality of dies; and validating a bonding surface of at least one die of the plurality of dies while the at least one die is mounted to the anti-static dicing tape.

13. The method of claim 12, wherein singulating through the substrate comprises partially dicing through a conductive region of the anti-static dicing tape.

14. The method of claim 12, further comprising electrically grounding the anti-static dicing tape during validation of the bonding surface of the at least one die.

15. The method of claim 12, wherein validating the bonding surface of the at least one die comprises measuring a conductive pad recess of the bonding surface of the at least one die by a metrological device.

16. The method of claim 12, wherein validating the bonding surface of the at least one die comprises measuring a surface roughness of the bonding surface of the at least one die by a metrological device.

17. A method of forming a microelectronic assembly, comprising:

mounting a substrate to an anti-static dicing tape, the anti-static dicing tape comprising an anti-static adhesive layer;

singulating through the substrate and partially through the anti-static adhesive layer to form a plurality of dies, wherein singulating through the substrate comprises partially dicing through a conductive region of the anti-static dicing tape.

18. The method of claim 17, further comprising validating a bonding surface of at least one die of the plurality of dies while the at least one die is mounted to the anti-static dicing tape.

19. The method of claim 18, further comprising electrically grounding the anti-static dicing tape during validation of the bonding surface of the at least one die.

* * * * *